(12) United States Patent
Pagaila et al.

(10) Patent No.: US 9,508,626 B2
(45) Date of Patent: Nov. 29, 2016

(54) SEMICONDUCTOR DEVICE AND METHOD OF FORMING OPENINGS IN THERMALLY-CONDUCTIVE FRAME OF FO-WLCSP TO DISSIPATE HEAT AND REDUCE PACKAGE HEIGHT

(75) Inventors: Reza A. Pagaila, Singapore (SG); Yaojian Lin, Singapore (SG)

(73) Assignee: STATS ChipPAC Pte. Ltd., Singapore (SG)

( * ) Notice: Subject to any disclaimer, the term of this patent is extended or adjusted under 35 U.S.C. 154(b) by 1690 days.

(21) Appl. No.: 12/766,607

(22) Filed: Apr. 23, 2010

(65) Prior Publication Data

US 2011/0260303 A1  Oct. 27, 2011

(51) Int. Cl.
*H01L 23/36* (2006.01)
*H01L 23/367* (2006.01)
(Continued)

(52) U.S. Cl.
CPC ........... *H01L 23/36* (2013.01); *H01L 23/3675* (2013.01); *H01L 23/3677* (2013.01); *H01L 23/49816* (2013.01); *H01L 23/552* (2013.01); *H01L 25/0657* (2013.01); *H01L 25/105* (2013.01); *H01L 21/561* (2013.01); *H01L 23/3121* (2013.01); *H01L 24/14* (2013.01); *H01L 24/16* (2013.01); *H01L 24/29* (2013.01); *H01L 24/32* (2013.01); *H01L 24/48* (2013.01); *H01L 24/73* (2013.01); *H01L 24/97* (2013.01); *H01L 2224/05571* (2013.01); *H01L 2224/05573* (2013.01); *H01L 2224/16225* (2013.01); *H01L 2224/16227* (2013.01); *H01L 2224/2919* (2013.01); *H01L 2224/29099* (2013.01); *H01L 2224/32225* (2013.01); *H01L 2224/48227* (2013.01); *H01L 2224/73204* (2013.01); *H01L 2224/73265* (2013.01); *H01L 2224/97* (2013.01); *H01L 2225/0651* (2013.01); *H01L 2225/06517* (2013.01); *H01L 2225/06541* (2013.01); *H01L 2225/06572* (2013.01); *H01L 2225/1023* (2013.01); *H01L 2225/1058* (2013.01); *H01L 2225/1088* (2013.01); *H01L 2225/1094* (2013.01); *H01L 2924/00014* (2013.01);
(Continued)

(58) Field of Classification Search
CPC ... H01L 21/56; H01L 23/36; H01L 23/3121; H01L 24/16; H01L 24/29
USPC ................ 257/713, 778, 660–686; 438/225; 361/818
See application file for complete search history.

(56) References Cited

U.S. PATENT DOCUMENTS 5,324,687 A * 6/1994 Wojnarowski ................ 438/107
5,835,355 A   11/1998 Dordi
(Continued)

*Primary Examiner* — Kenneth Parker
*Assistant Examiner* — Fang-Xing Jiang
(74) *Attorney, Agent, or Firm* — Robert D. Atkins; Atkins and Associates, P.C.

(57) ABSTRACT

A semiconductor device has a thermally-conductive frame and interconnect structure formed over the frame. The interconnect structure has an electrical conduction path and thermal conduction path. A first semiconductor die is mounted to the electrical conduction path and thermal conduction path of the interconnect structure. A portion of a back surface of the first die is removed by grinding. An EMI shielding layer can be formed over the first die. The first die can be mounted in a recess of the thermally-conductive frame. An opening is formed in the thermally-conductive frame extending to the electrical conduction path of the interconnect structure. A second semiconductor die is mounted over the thermally-conductive frame opposite the first die. The second die is electrically connected to the interconnect structure using a bump disposed in the opening of the thermally-conductive frame.

26 Claims, 12 Drawing Sheets

(51) Int. Cl.
    *H01L 23/498*     (2006.01)
    *H01L 23/552*     (2006.01)
    *H01L 25/065*     (2006.01)
    *H01L 25/10*     (2006.01)
    H01L 21/56     (2006.01)
    H01L 23/31     (2006.01)
    H01L 23/00     (2006.01)

(52) U.S. Cl.
    CPC ........... *H01L2924/01079* (2013.01); *H01L 2924/01322* (2013.01); *H01L 2924/12041* (2013.01); *H01L 2924/13091* (2013.01); *H01L 2924/1431* (2013.01); *H01L 2924/1433* (2013.01); *H01L 2924/1434* (2013.01); *H01L 2924/14335* (2013.01); *H01L 2924/15311* (2013.01); *H01L 2924/15321* (2013.01); *H01L 2924/15331* (2013.01); *H01L 2924/181* (2013.01); *H01L 2924/18161* (2013.01); *H01L 2924/3025* (2013.01)

(56) References Cited

U.S. PATENT DOCUMENTS

| | | |
|---|---|---|
| 6,683,795 B1 | 1/2004 | Yoo |
| 2004/0150977 A1* | 8/2004 | Hsieh .................. 361/818 |
| 2005/0121764 A1* | 6/2005 | Mallik et al. ............ 257/686 |
| 2006/0091511 A1* | 5/2006 | Kim et al. ............... 257/678 |
| 2006/0125113 A1* | 6/2006 | Liu et al. ................. 257/778 |
| 2009/0236733 A1* | 9/2009 | Chow et al. ............. 257/713 |

\* cited by examiner

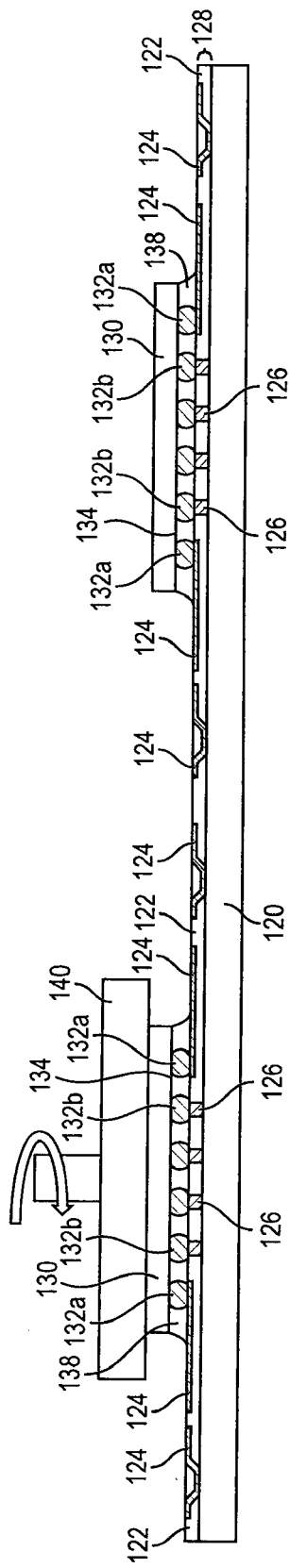
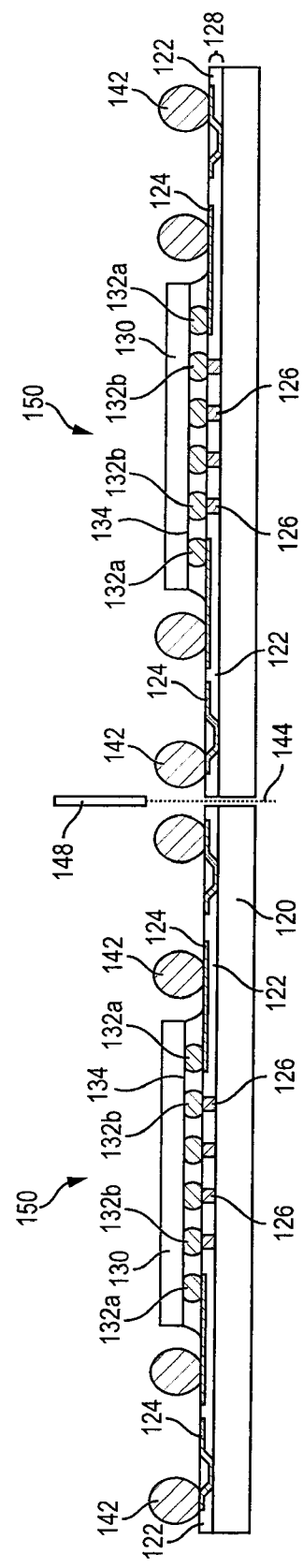
FIG. 3d
FIG. 3e

SEMICONDUCTOR DEVICE AND METHOD OF FORMING OPENINGS IN THERMALLY-CONDUCTIVE FRAME OF FO-WLCSP TO DISSIPATE HEAT AND REDUCE PACKAGE HEIGHT

FIELD OF THE INVENTION

The present invention relates in general to semiconductor devices and, more particularly, to a semiconductor device and method of forming openings in a thermally-conductive frame of a FO-WLCSP to dissipate heat and reduce package height.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

In fan-out wafer level chip scale packages (FO-WLCSP), semiconductor die are stacked and vertically interconnected within the package. The FO-WLCSP generates considerable thermal energy which must be adequately dissipated. In high frequency applications, the FO-WLCSP can emit or be susceptible to radiation, electromagnetic interference (EMI), radio frequency interference (RFI), harmonic effects, and other inter-device interference, which reduces the electrical performance of the device.

SUMMARY OF THE INVENTION

A need exists to dissipate thermal energy and shield against inter-device interference in a FO-WLCSP in a low profile package. Accordingly, in one embodiment, the present invention is a method of making a semiconductor device comprising the steps of providing a thermally-conductive frame, and forming an interconnect structure over the thermally-conductive frame. The interconnect structure includes an electrical conduction path and thermal conduction path. The method further includes the steps of mounting a first semiconductor die to the electrical conduction path and thermal conduction path of the interconnect structure over a first surface of the thermally-conductive frame, removing a portion of a back surface of the first semiconductor die, forming an opening in the thermally-conductive frame extending to the electrical conduction path of the interconnect structure, and mounting a second semiconductor die over a second surface of the thermally-conductive frame, opposite the first surface of the thermally-conductive frame. The second semiconductor die is electrically connected to the interconnect structure using a bump disposed in the opening of the thermally-conductive frame.

In another embodiment, the present invention is a method of making a semiconductor device comprising the steps of providing a thermally-conductive frame, forming an opening through the thermally-conductive frame, depositing sacrificial material in the opening of the thermally-conductive frame, and forming an interconnect structure over the thermally-conductive frame. The interconnect structure includes an electrical conduction path and thermal conduction path. The method further includes the steps of mounting a first semiconductor die to the electrical conduction path and thermal conduction path of the interconnect structure, removing the sacrificial material from the opening of the thermally-conductive frame, and mounting a second semiconductor die over a surface of the thermally-conductive frame opposite the first semiconductor die. The second semiconductor die is electrically connected to the interconnect structure conductive layer using a bump disposed in the opening of the thermally-conductive frame.

In another embodiment, the present invention is a method of making a semiconductor device comprising the steps of providing a thermally-conductive frame, and forming an interconnect structure over the thermally-conductive frame. The interconnect structure includes an electrical conduction path and thermal conduction path. The method further includes the steps of mounting a first semiconductor die to the electrical conduction path and thermal conduction path of the interconnect structure, and forming an opening in the thermally-conductive frame.

In another embodiment, the present invention is a semiconductor device comprising a thermally-conductive frame and interconnect structure formed over the thermally-conductive frame. The interconnect structure includes an electrical conduction path and thermal conduction path. A first semiconductor die is mounted to the electrical conduction path and thermal conduction path of the interconnect structure. An opening is formed in the thermally-conductive frame. A second semiconductor die is mounted over a surface of the thermally-conductive frame opposite the first semiconductor die. The second semiconductor die is electrically connected to the electrical conduction path of the interconnect structure using a bump disposed in the opening of the thermally-conductive frame.

BRIEF DESCRIPTION OF THE DRAWINGS

FIGS. 3a-3g illustrate a process of forming openings in a thermally-conductive frame of FO-WLCSP to dissipate heat and reduce package height;

DETAILED DESCRIPTION OF THE DRAWINGS

Figure 1:
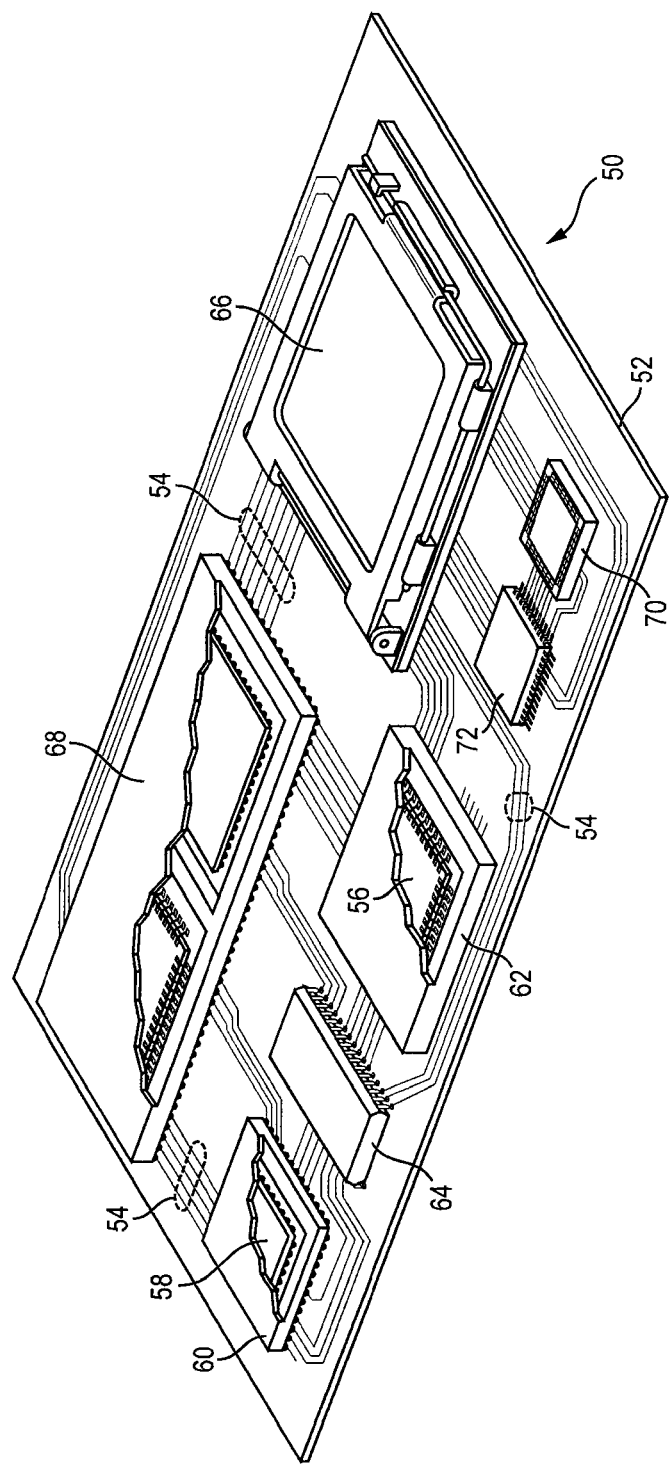
FIG. 1 illustrates a PCB with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping, arranged as necessary, to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 may have one type of semiconductor package, or multiple types of semiconductor packages, depending on the application. The different types of semiconductor packages are shown in FIG. 1 for purposes of illustration.

Electronic device 50 may be a stand-alone system that uses the semiconductor packages to perform one or more electrical functions. Alternatively, electronic device 50 may be a subcomponent of a larger system. For example, electronic device 50 may be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 2A:
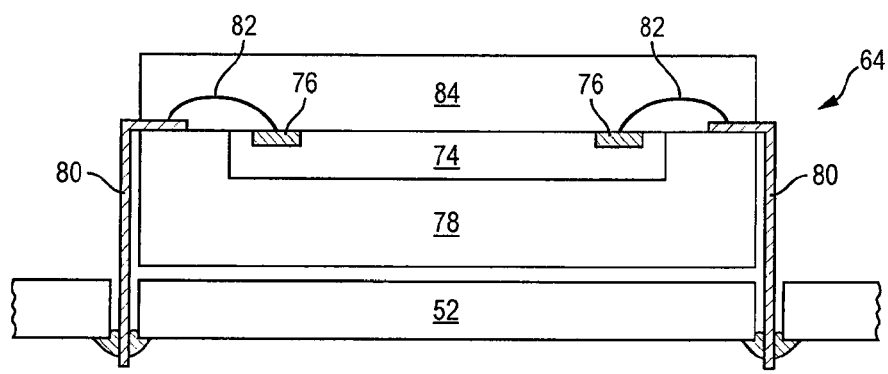
FIGS. 2a-2c illustrate further detail of the representative semiconductor packages mounted to the PCB.
Figure 2B:
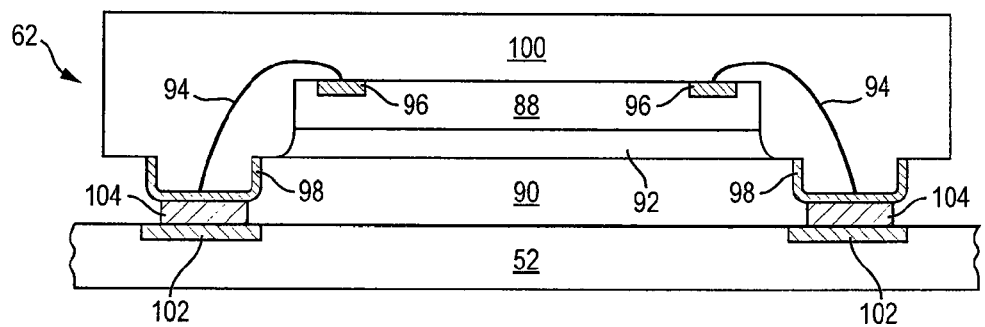
Figure 2C:
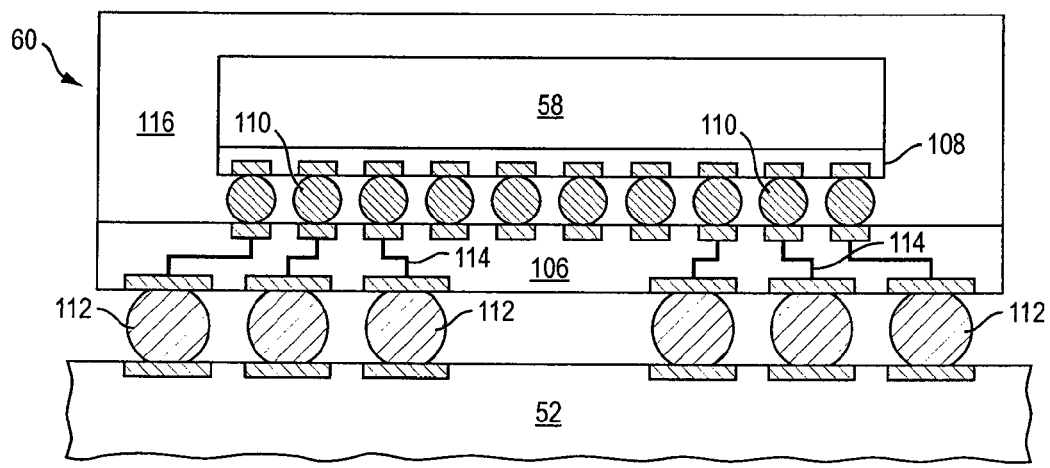

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit may include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and wire bonds 82 provide electrical interconnect between semiconductor die 74 and PCB 52. Encapsulant 84 is deposited over the package for environmental protection by preventing moisture and particles from entering the package and contaminating die 74 or wire bonds 82.

FIG. 2b illustrates further detail of BCC 62 mounted on PCB 52. Semiconductor die 88 is mounted over carrier 90 using an underfill or epoxy-resin adhesive material 92. Wire bonds 94 provide first level packing interconnect between contact pads 96 and 98. Molding compound or encapsulant 100 is deposited over semiconductor die 88 and wire bonds 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flip chip style first level packaging. Active region 108 of semiconductor die 58 contains analog or digital circuits implemented as active devices, passive devices, conductive layers, and dielectric layers formed according to the electrical design of the die. For example, the circuit may include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flip chip style first level packaging without intermediate carrier 106.

Figure 3A:
Figure 3B:
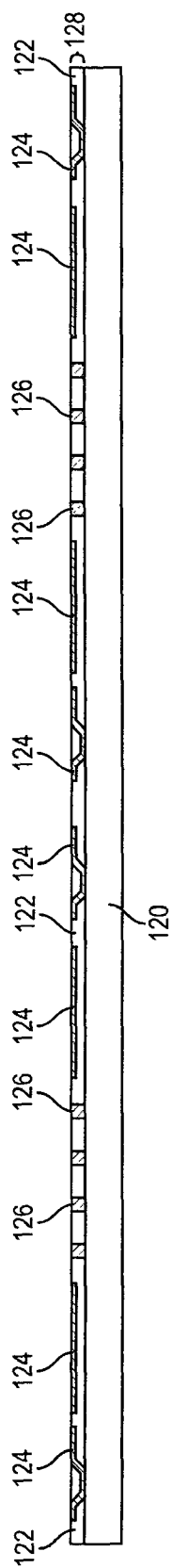

FIGS. 3a-3g illustrate, in relation to FIGS. 1 and 2a-2c, a process of forming openings in a thermally-conductive frame of FO-WLCSP to dissipate heat and reduce package height. In FIG. 3a, wafer-form frame or heat spreader 120 can be Al, Cu, or another material with high thermal conductivity to provide heat dissipation and structural support. In FIG. 3b, an insulating or dielectric layer 122 is formed over thermally-conductive frame 120 using PVD, CVD, printing, spin coating, spray coating, or thermal oxidation. The insulating layer 122 can be one or more layers of silicon dioxide (SiO2), silicon nitride (Si3N4), silicon oxynitride (SiON), tantalum pentoxide (Ta2O5), aluminum oxide (Al2O3), polyimide, benzocyclobutene (BCB), polybenzoxazoles (PBO), or other dielectric material having similar insulating and structural properties.

An electrically conductive layer 124 is formed over insulating layer 122 using patterning with PVD, CVD, sputtering, electrolytic plating, electroless plating process, or other suitable metal deposition process. Conductive layer 124 can be one or more layers of Al, Cu, Sn, Ni, Au, Ag, or other suitable electrically conductive material. Some portions of conductive layer 124 extend through insulating layer 122 to frame 120. The portions of conductive layers 124 can be electrically common or electrically isolated depending on the design and function of the semiconductor device.

A plurality of vias is formed through insulating layer 122 to frame 120 using laser drilling or etching process. The vias are filled with Al, Cu, or other suitable thermally conductive material using PVD, CVD, electrolytic plating, electroless plating process, or other suitable metal deposition process to form thermally-conductive through hole vias (THV) 126. The insulating layer 122, conductive layer 124, and THVs 126 constitute an interconnect structure 128 formed over the thermally-conductive frame with an electrical conduction path as conductive layer 124 and thermal conduction path as THV 126.

Figure 3C:
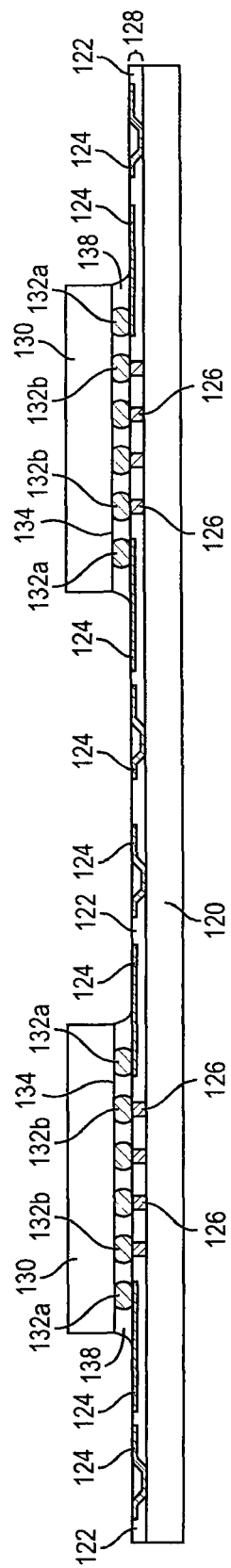

In FIG. 3c, semiconductor die 130 are mounted over a first surface of frame 120 to conductive layer 124 and THVs 126 using bumps 132. Each semiconductor die 130 include an active surface 134 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 134 to implement analog circuits or digital circuits, such as digital signal processor (DSP), ASIC, memory, or other signal processing circuit. Semiconductor die 130 may also contain IPDS, such as inductors, capacitors, and resistors, for RF signal processing. In one embodiment, semiconductor die 130 is a flipchip type device. Bumps 132a provide electrical connection between circuits within semiconductor die 130 and conductive layer 124. Bumps 132b provide thermal conduction between semiconductor die 130 and frame 120. An underfill material 138, such as epoxy resin, is deposited under semiconductor die 130.

In FIG. 3d, grinder 140 removes excess bulk material from a backside of semiconductor wafer 130, opposite active surface 134, to reduce thickness of the die prior to singulation.

In FIG. 3e, an electrically conductive bump material is deposited over conductive layer 124 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 124 using a suitable attachment or bonding process. In one embodiment, the bump material is reflowed by heating the material above its melting point to form spherical balls or bumps 142. In some applications, bumps 142 are reflowed a second time to improve electrical contact to conductive layer 124. The bumps can also be compression bonded to conductive layer 124. Bumps 142 represent one type of interconnect structure that can be formed over conductive layer 124. The interconnect structure can also use bond wires, stud bump, micro bump, or other electrical interconnect.

The wafer-form frame 120 is singulated along line 144 with saw blade or laser cutting tool 148 into individual FO-WLCSP 150.

Figure 3F:
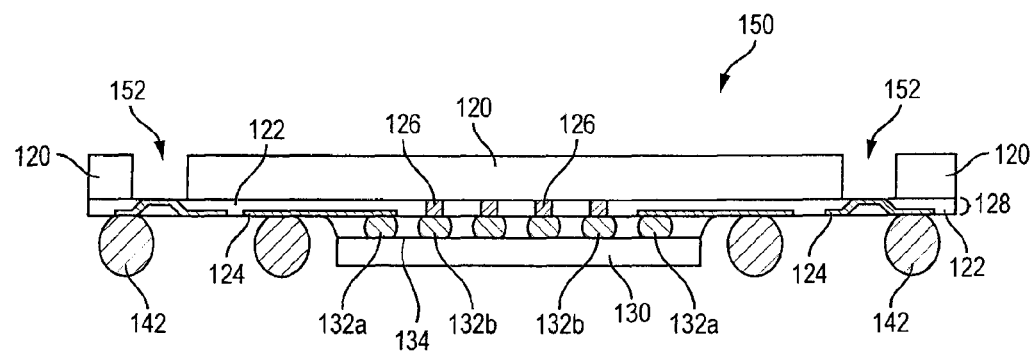

Post-singulation FO-WLCSP 150 is inverted in FIG. 3f and a portion of frame 120 is removed using a laser drilling or etching process to form hollowed openings or through holes 152 and expose a backside of conductive layer 124 which extended through insulating layer 122 to frame 120, as described in FIG. 3b. Openings 152 can also be formed prior to singulation.

Figure 3G:
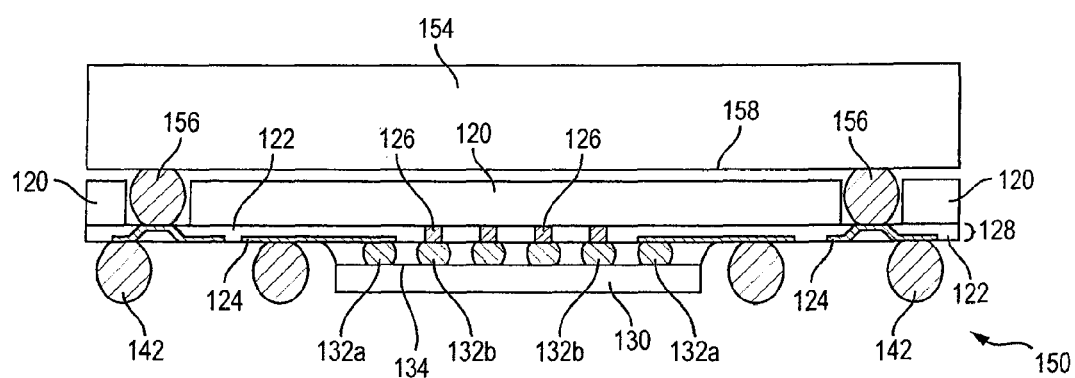

In FIG. 3g, semiconductor die 154 is mounted over a second surface of frame 120 opposite semiconductor die 130 to conductive layer 124 using bumps 156. Semiconductor die 154 includes an active surface 158 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 158 to implement analog circuits or digital circuits, such as DSP, ASIC, memory, or other signal processing circuit. Semiconductor die 154 may also contain IPDS, such as inductors, capacitors, and resistors, for RF signal processing. In one embodiment, semiconductor die 154 is a flipchip type device. Alternatively, a discrete semiconductor device is mounted over thermally-conductive frame 120 to conductive layer 124 with bumps disposed within openings 152.

Semiconductor die 130 in FO-WLCSP 150 dissipates heat through bumps 132b and thermally-conductive frame 120. Semiconductor die 154 is electrically connected through bumps 156 and 132a and conductive layer 124 to semiconductor die 130, and further through bumps 142 to external devices. Bumps 156 are disposed within openings 152 of frame 120 to reduce the height of FO-WLCSP 150 and simplify semiconductor package stacking. Openings 152 are sufficiently large to contain bumps 156 without electrical shorting to frame 120.

Figure 4A:
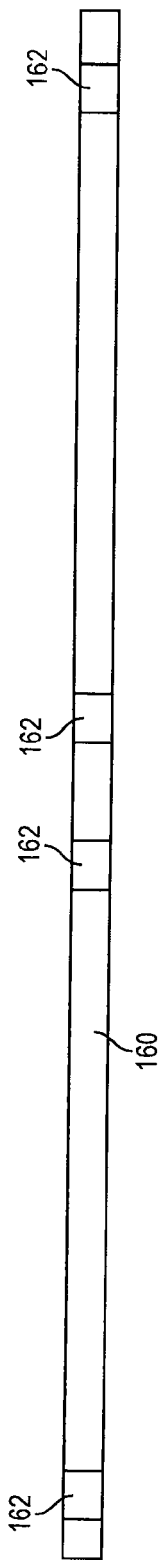
FIGS. 4a-4g illustrate another process of forming openings in a thermally-conductive frame of FO-WLCSP to dissipate heat and reduce package height.

FIGS. 4a-4g illustrate, in relation to FIGS. 1 and 2a-2c, another process of forming openings in a thermally-conductive frame of FO-WLCSP to dissipate heat and reduce package height. In FIG. 4a, wafer-form frame or heat spreader 160 can be Al, Cu, or another material with high thermal conductivity to provide heat dissipation and structural support. A plurality of openings or through holes is formed in frame 160 using laser drilling or etching process. The openings are filled with sacrificial material 162, such as a B-stage polymer or heat-releasable materials. The sacrificial material 162 is releasable with ultra-violet (UV) light or heat.

Figure 4B:
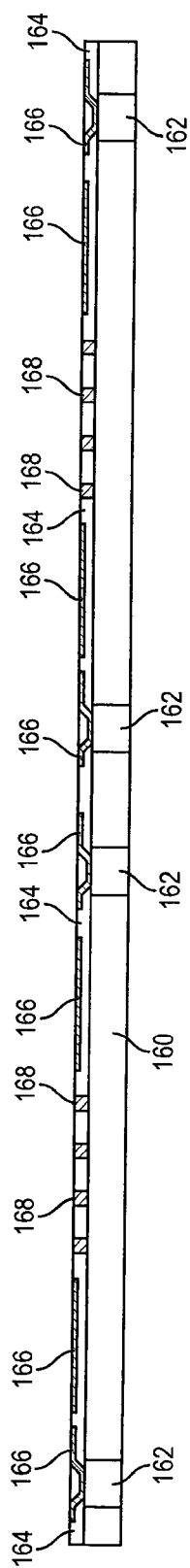

In FIG. 4b, an insulating or dielectric layer 164 is formed over thermally-conductive frame 160 and sacrificial material 162 using PVD, CVD, printing, spin coating, spray coating, or thermal oxidation. The insulating layer 164 can be one or more layers of SiO2, Si3N4, SiON, Ta2O5, Al2O3, polyimide, BCB, PBO, or other dielectric material having similar insulating and structural properties.

An electrically conductive layer 166 is formed over insulating layer 164 using patterning with PVD, CVD, sputtering, electrolytic plating, electroless plating process, or other suitable metal deposition process. Conductive layer 166 can be one or more layers of Al, Cu, Sn, Ni, Au, Ag, or other suitable electrically conductive material. Some portions of conductive layer 166 extend through insulating layer 164 to sacrificial material 162. The portions of conductive layers 166 can be electrically common or electrically isolated depending on the design and function of the semiconductor device.

A plurality of vias is formed through insulating layer 164 to frame 160 using laser drilling or etching process. The vias are filled with Al, Cu, or other suitable thermally conductive material using PVD, CVD, electrolytic plating, electroless plating process, or other suitable metal deposition process to form thermally-conductive THV 168. The insulating layer 164, conductive layer 166, and THVs 168 constitute an interconnect structure formed over the thermally-conductive frame with an electrical conduction path as conductive layer 166 and thermal conduction path as THV 168.

Figure 4C:
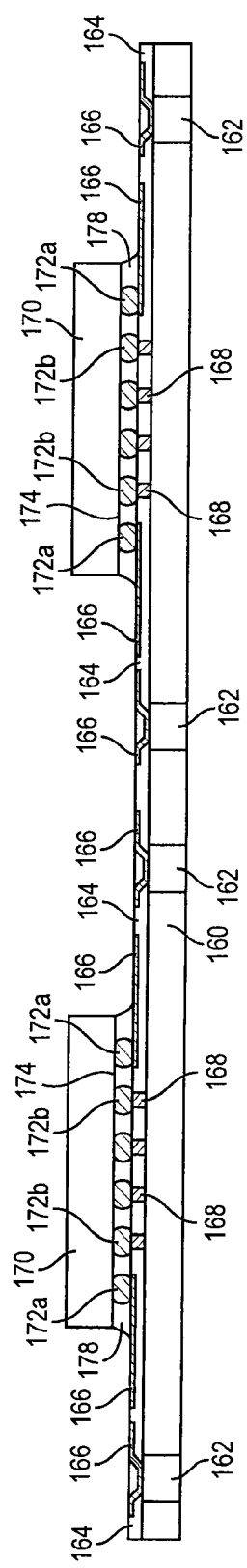

In FIG. 4c, semiconductor die 170 are mounted over a first surface of frame 160 to conductive layer 166 and THVs 168 using bumps 172. Each semiconductor die 170 include an active surface 174 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 174 to implement analog circuits or digital circuits, such as DSP, ASIC, memory, or other signal processing circuit. Semiconductor die 170 may also contain IPDS, such as inductors, capacitors, and resistors, for RF signal processing. In one embodiment, semiconductor die 170 is a flipchip type device. Bumps 172a provide electrical connection between circuits within semiconductor die 170 and conductive layer 166. Bumps 172b provide thermal conduction between semiconductor die 170 and frame 160. An underfill material 178, such as epoxy resin, is deposited under semiconductor die 170.

Figure 4D:
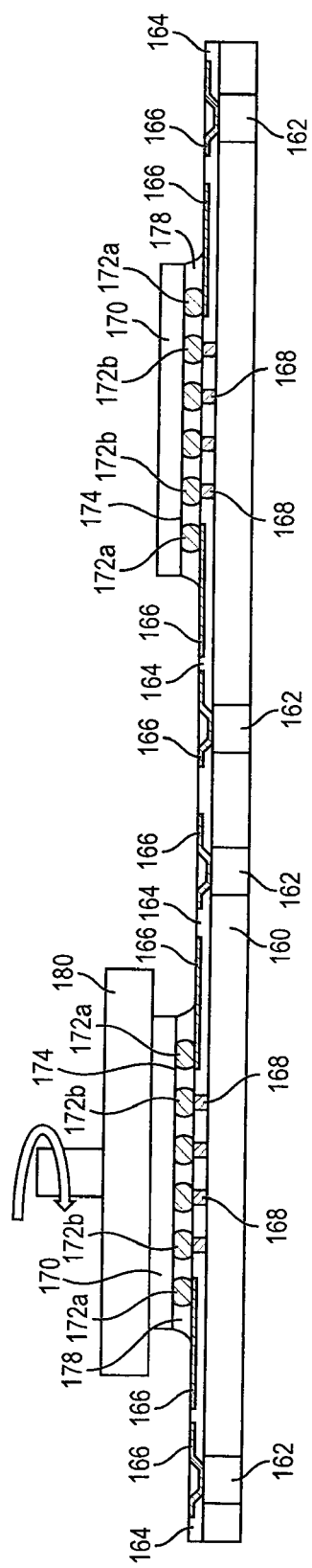

In FIG. 4d, grinder 180 removes excess bulk material from a backside of semiconductor wafer 170, opposite active surface 174, to reduce thickness of the die prior to singulation.

Figure 4E:
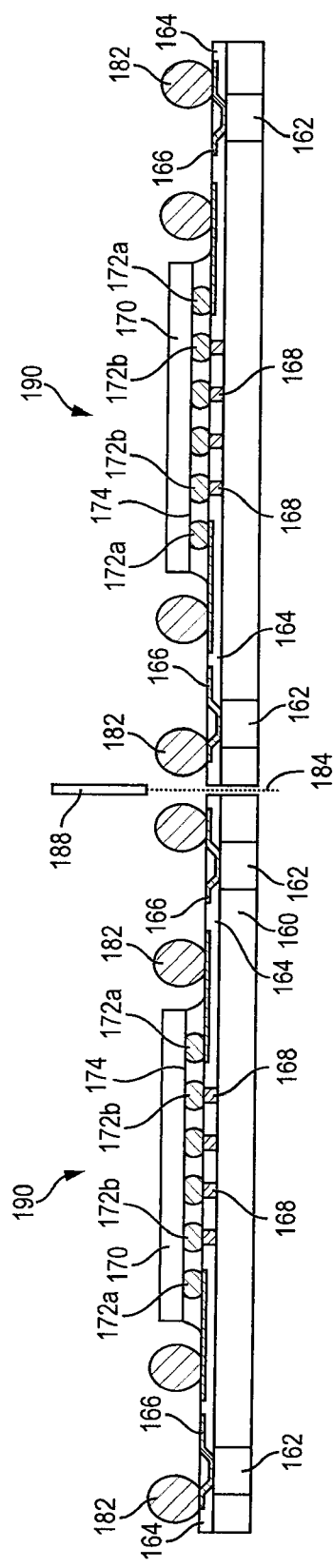

In FIG. 4e, an electrically conductive bump material is deposited over conductive layer 166 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 166 using a suitable attachment or bonding process. In one embodiment, the bump material is reflowed by heating the material above its melting point to form spherical balls or bumps 182. In some applications, bumps 182 are reflowed a second time to improve electrical contact to conductive layer 166. The bumps can also be compression bonded to conductive layer 166. Bumps 182 represent one type of interconnect structure that can be formed over conductive layer 166. The interconnect structure can also use bond wires, stud bump, micro bump, or other electrical interconnect.

The wafer-form frame 160 is singulated along line 184 with saw blade or laser cutting tool 188 into individual FO-WLCSP 190.

Figure 4F:
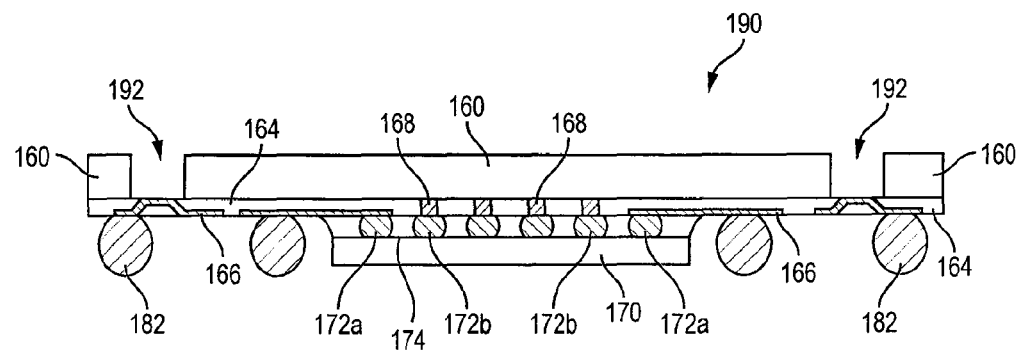

Post-singulation FO-WLCSP 190 is inverted in FIG. 4f and sacrificial material 162 is removed using UV or heat leaving hollowed openings or through holes 192. Openings 192 expose a backside of conductive layer 166 which extended through insulating layer 164 to sacrificial material 162, as described in FIG. 4b. Sacrificial material 162 can also be removed prior to singulation.

Figure 4G:
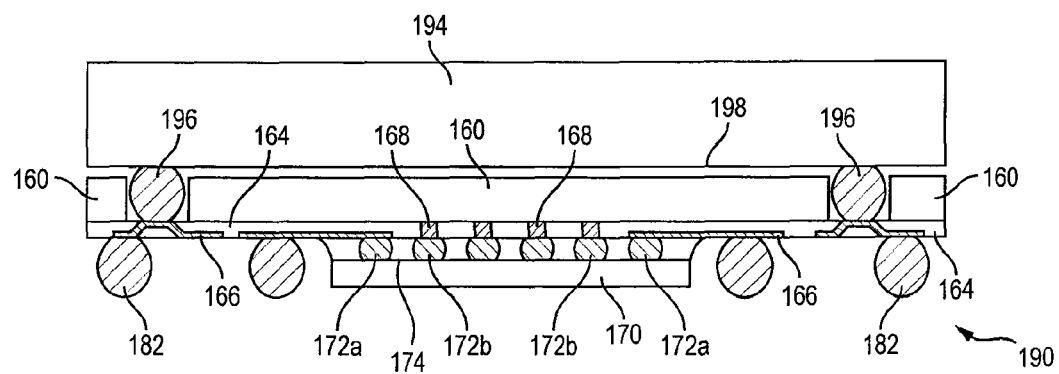

In FIG. 4g, semiconductor die 194 is mounted over a second surface of frame 160 opposite semiconductor die 170 to conductive layer 166 using bumps 196. Semiconductor die 194 includes an active surface 198 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 198 to implement analog circuits or digital circuits, such as DSP, ASIC, memory, or other signal processing circuit. Semiconductor die 194 may also contain IPDS, such as inductors, capacitors, and resistors, for RF signal processing. In one embodiment, semiconductor die 194 is a flipchip type device. Alternatively, a discrete semiconductor device is mounted over frame 160 to conductive layer 166 with bumps disposed within openings 192.

Semiconductor die 170 in FO-WLCSP 190 dissipates heat through bumps 172b and thermally-conductive frame 160. Semiconductor die 194 is electrically connected through bumps 196 and 172a and conductive layer 166 to semiconductor die 170, and further through bumps 182 to external devices. Bumps 196 are disposed within openings 192 of frame 160 to reduce the height of FO-WLCSP 190 and simplify semiconductor package stacking. Openings 192 are sufficiently large to contain bumps 196 without electrical shorting to frame 160.

Figure 5:
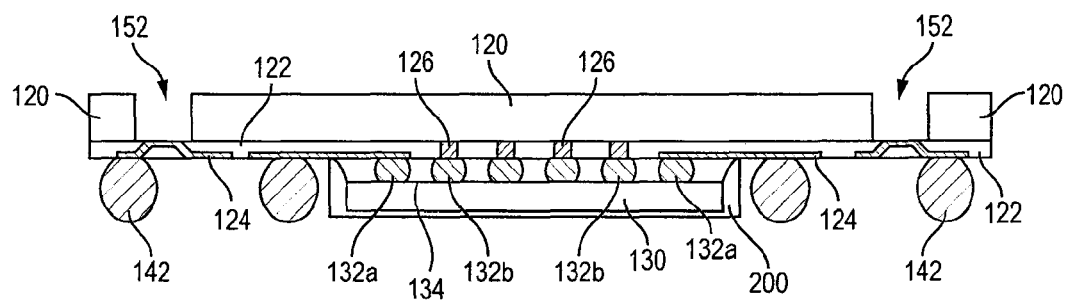
FIG. 5 illustrates an encapsulant formed around the semiconductor die.

FIG. 5 shows an embodiment continuing from FIG. 3f with an encapsulant 200 deposited over semiconductor die 130 using a paste printing, compressive molding, transfer molding, liquid encapsulant molding, vacuum lamination, spin coating, or other suitable applicator. Encapsulant 200 can be polymer composite material, such as epoxy resin with filler, epoxy acrylate with filler, or polymer with proper filler. Encapsulant 200 is non-conductive and environmentally protects the semiconductor device from external elements and contaminants.

Figure 6:
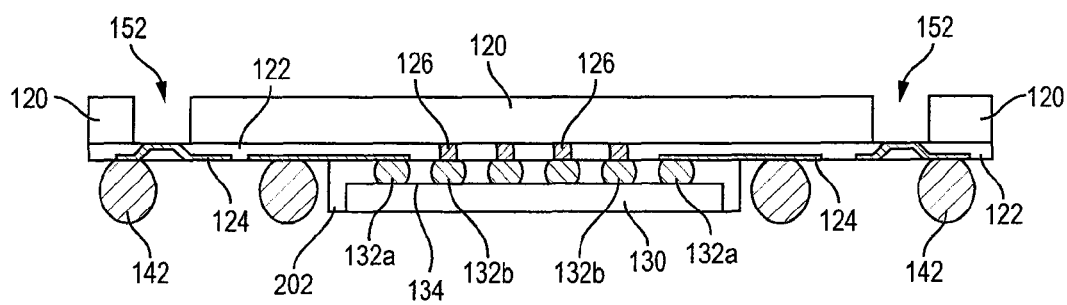
FIG. 6 illustrates an encapsulant formed around the semiconductor die with the backside of the die exposed.

FIG. 6 shows an embodiment without underfill material 138 in FIG. 3c. Instead, an encapsulant 202 is deposited over and around semiconductor die 130 using a paste printing, compressive molding, transfer molding, liquid encapsulant molding, vacuum lamination, spin coating, or other suitable applicator. Encapsulant 202 can be polymer composite material, such as epoxy resin with filler, epoxy acrylate with filler, or polymer with proper filler. Encapsulant 202 is removed during the grinding process of FIG. 3d to expose a backside of semiconductor die 130 opposite active surface 134.

Figure 7:
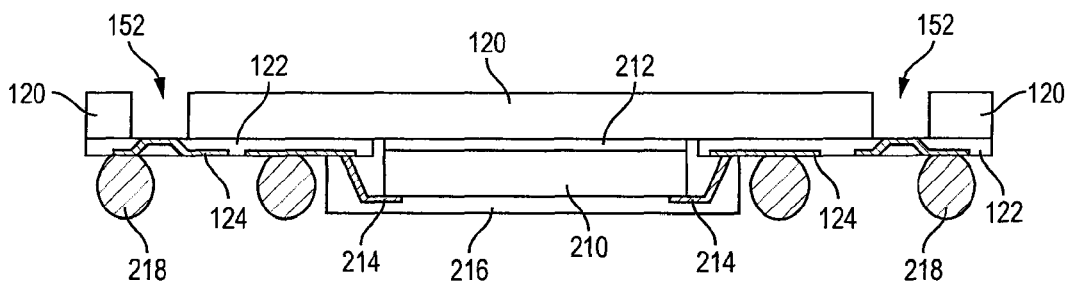
FIG. 7 illustrates an encapsulant formed around the semiconductor die with bond wire electrical interconnection.

FIG. 7 shows an embodiment, continuing from FIG. 3b, with semiconductor die 210 mounted to thermally-conductive frame 120 with thermal interface material (TIM) 212. TIM 212 can be aluminum oxide, zinc oxide, boron nitride, or pulverized silver. Semiconductor die 210 contains analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within its active surface to implement analog circuits or digital circuits, such as DSP, ASIC, memory, or other signal processing circuit. Semiconductor die 210 may also contain IPDS, such as inductors, capacitors, and resistors, for RF signal processing. The circuits on semiconductor die 210 are electrically connected to conductive layer 124 with bond wires 214.

An encapsulant 216 is deposited over semiconductor die 210 using a paste printing, compressive molding, transfer molding, liquid encapsulant molding, vacuum lamination, spin coating, or other suitable applicator. Encapsulant 216 can be polymer composite material, such as epoxy resin with filler, epoxy acrylate with filler, or polymer with proper filler. Encapsulant 216 is non-conductive and environmentally protects the semiconductor device from external elements and contaminants.

An electrically conductive bump material is deposited over conductive layer 124 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 124 using a suitable attachment or bonding process. In one embodiment, the bump material is reflowed by heating the material above its melting point to form spherical balls or bumps 218. In some applications, bumps 218 are reflowed a second time to improve electrical contact to conductive layer 124. The bumps can also be compression bonded to conductive layer 124. Bumps 218 represent one type of interconnect structure that can be formed over conductive layer 124. The interconnect structure can also use bond wires, stud bump, micro bump, or other electrical interconnect.

Figure 8:
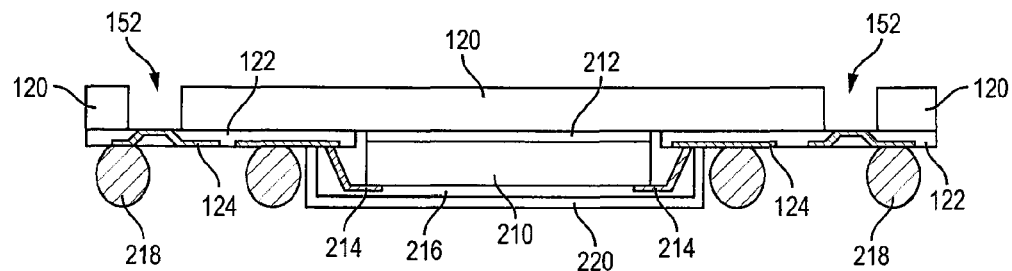
FIG. 8 illustrates an EMI shielding layer formed around the semiconductor die.

FIG. 8 shows an embodiment, continuing from FIG. 7, with a shielding layer 220 formed over or mounted to encapsulant 216 surrounding semiconductor die 210. Shielding layer 220 can be Cu, Al, ferrite or carbonyl iron, stainless steel, nickel silver, low-carbon steel, silicon-iron steel, foil, epoxy, conductive resin, and other metals and composites capable of blocking or absorbing EMI, RFI, and other inter-device interference. Shielding layer 220 can also be a non-metal material such as carbon-black or aluminum flake to reduce the effects of EMI and RFI. Shielding layer 220 is grounded through conductive layer 124 and bumps 218. An EMI shielding layer can also be mounted over a flipchip type semiconductor die, such as shown in FIG. 5.

Figure 9:
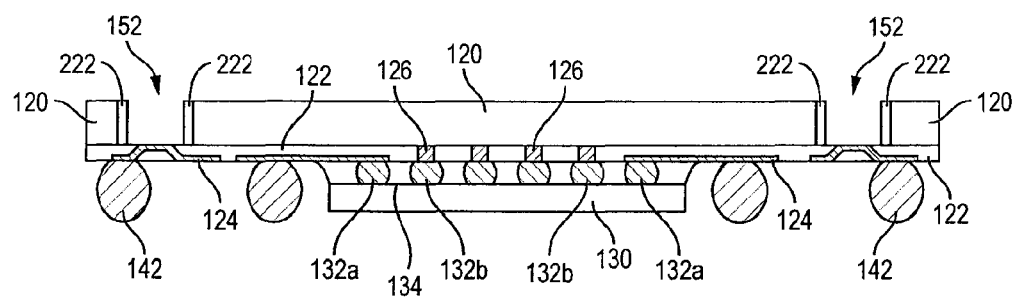
FIG. 9 illustrates an insulating layer formed in the openings of the thermally-conductive frame.

FIG. 9 shows an embodiment, continuing from FIG. 3f, with an insulating or dielectric layer 222, such as SiO2 or Al2O3, formed around the sidewalls of openings 152 to prevent electrical shorting between bumps 156 and frame 120.

Figure 10:
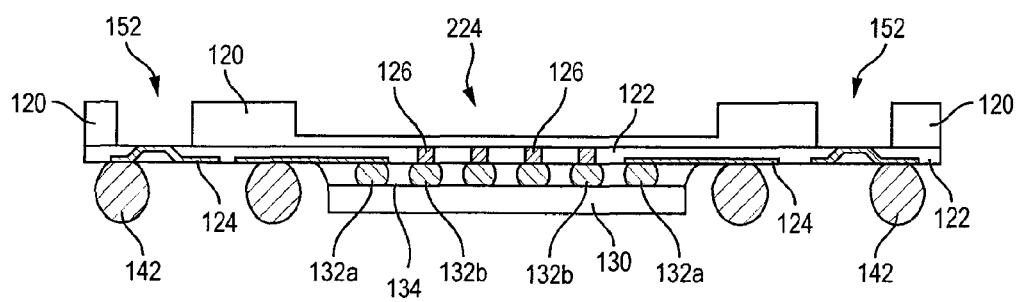
FIG. 10 illustrates a recess formed in the thermally-conductive frame.

FIG. 10 shows an embodiment, continuing from FIG. 3f, with a recess or cavity 224 formed in frame 120 to accommodate another semiconductor die while maintaining a low vertical profile for the FO-WLCSP.

Figure 11:
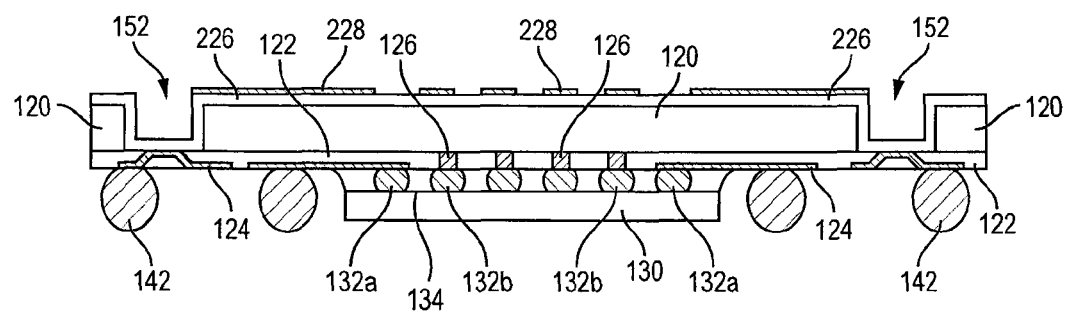
FIG. 11 illustrates an RDL formed over the thermally-conductive frame.

FIG. 11 shows an embodiment, continuing from FIG. 3f, with an insulating or dielectric layer 226, such as SiO2 or Al2O3, formed over frame 120 and into openings 152. The insulating layer 226 follows the contour of frame 120 and openings 152. An electrically conductive layer 228 is formed over insulating layer 226 using patterning with PVD, CVD, sputtering, electrolytic plating, electroless plating process, or other suitable metal deposition process. Conductive layer 228 can be one or more layers of Al, Cu, Sn, Ni, Au, Ag, or other suitable electrically conductive material. Conductive layer 228 operates as a redistribution layer to extend electrical interconnect to external devices.

Figure 12:
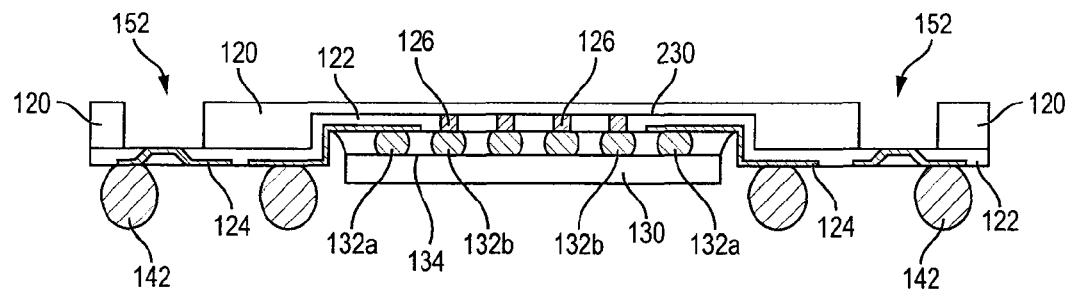
FIG. 12 illustrates the semiconductor die mounted in a recess formed in the thermally-conductive frame.

FIG. 12 shows an embodiment, similar to FIG. 3f, with a recess or cavity 230 formed in a surface of frame 120 prior to mounting semiconductor die 130. The insulating layer 122 and conductive layer 124 follow the contour of recess 230 in frame 120. Recess 230 reduces the thickness of the FO-WLCSP while providing heat dissipation for semiconductor die 130 through THVs 126 and thermally-conductive frame 120.

In another an embodiment, continuing from FIG. 3f, FO-WLCSP 150 is inverted and an encapsulant 232 is deposited over semiconductor die 130 and bumps 142 using a paste printing, compressive molding, transfer molding, liquid encapsulant molding, vacuum lamination, spin coating, or other suitable applicator. Encapsulant 232 can be polymer composite material, such as epoxy resin with filler, epoxy acrylate with filler, or polymer with proper filler. Encapsulant 232 is non-conductive and environmentally protects the semiconductor device from external elements and contaminants.

Figure 13A:
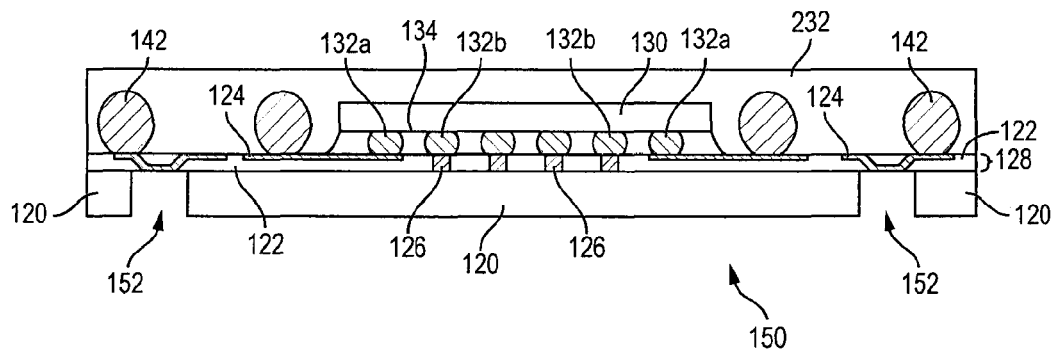
FIGS. 13a-13c illustrate an encapsulant deposited over the semiconductor die and back grinded to expose the bumps.
Figure 13B:
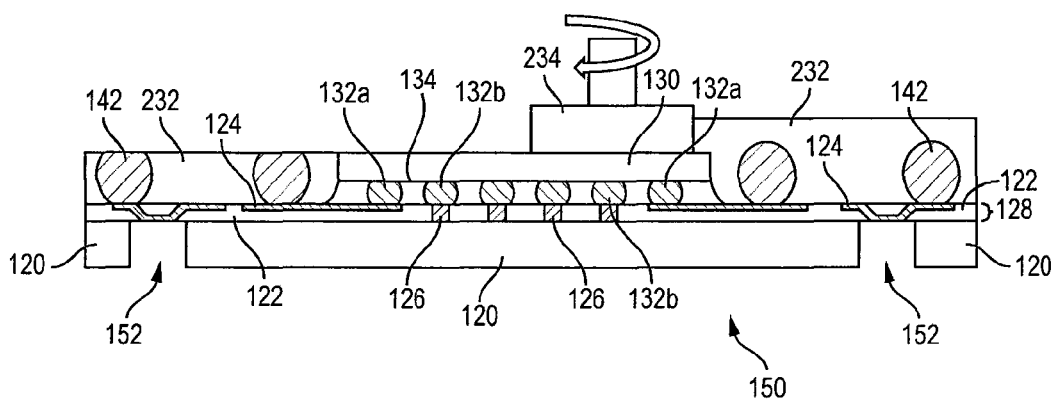
Figure 13C:
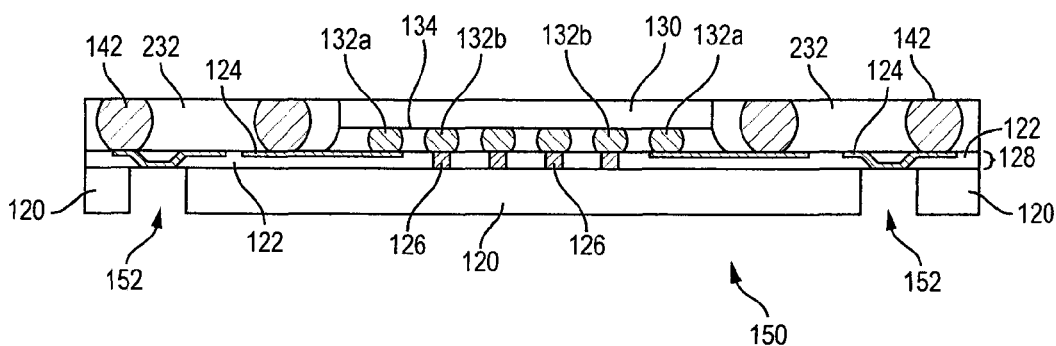

In FIG. 13b, grinder 234 removes a portion of encapsulant 232 to expose bumps 142. FIG. 13c shows semiconductor die 130 covered by encapsulant 232 with bumps 142 exposed from the encapsulant.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a thermally-conductive frame;
   forming an opening through the thermally-conductive frame;
   depositing a sacrificial material in the opening of the thermally-conductive frame;
   forming an interconnect structure over the thermally-conductive frame, the interconnect structure including an electrical conduction path and thermal conduction path;
   mounting a first semiconductor die to the electrical conduction path and thermal conduction path of the interconnect structure;
   removing the sacrificial material from the opening of the thermally-conductive frame; and
   mounting a second semiconductor die over a surface of the thermally-conductive frame opposite the first semiconductor die, the second semiconductor die being electrically connected to the interconnect structure using a first bump disposed in the opening of the thermally-conductive frame.

2. The method of claim 1, further including removing a portion of a back surface of the first semiconductor die.

3. The method of claim 1, further including forming a recess in the surface of the thermally-conductive frame opposite the first semiconductor die.

4. The method of claim 1, further including depositing an underfill beneath the first semiconductor die.

5. The method of claim 1, further including depositing an encapsulant over the first semiconductor die.

6. The method of claim 1, further including forming a shielding layer over the first semiconductor die.

7. The method of claim 1, further including:
forming a plurality of second bumps over the thermally-conductive frame;
depositing an encapsulant over the first semiconductor die and second bumps; and
removing a portion of the encapsulant to expose the second bumps.

8. The method of claim 1, further including:
forming the opening prior to forming the interconnect structure; and
removing the sacrificial material prior to mounting the second semiconductor die.

9. The method of claim 1, wherein a portion of the electrical conduction path and a portion of the thermal conduction path each are vertically aligned between a footprint of the first semiconductor die and the thermally-conductive frame.

10. The method of claim 1, further including forming a second bump over the first semiconductor die and electrically connected to the interconnect structure.

11. The method of claim 1, wherein forming the interconnect structure further includes:
forming an insulating layer over the thermally-conductive frame;
forming a conductive layer over and extending through the insulating layer to form the electrical conduction path; and
forming a thermally-conductive via through the insulating layer to the thermally-conductive frame to form the thermal conduction path.

12. A method of making a semiconductor device, comprising:
providing a thermally-conductive frame;
forming an interconnect structure over the thermally-conductive frame, the interconnect structure including an electrical interconnect path and thermal conduction path;
mounting a first semiconductor die to the electrical interconnect path and thermal conduction path of the interconnect structure; and
forming an opening through the thermally-conductive frame.

13. The method of claim 12, further including mounting a second semiconductor die over a surface of the thermally-conductive frame opposite the first semiconductor die with the second semiconductor die electrically connected to the electrical interconnect path of the interconnect structure using a bump disposed in the opening of the thermally-conductive frame.

14. The method of claim 13, further including:
forming the opening prior to forming the interconnect structure;
depositing a sacrificial material in the opening of the thermally-conductive frame; and
removing the sacrificial material prior to mounting the second semiconductor die.

15. The method of claim 12, wherein forming the interconnect structure further includes:
forming an insulating layer over the thermally-conductive frame;
forming a conductive layer over and extending through the insulating layer to form the electrical interconnect path; and
forming a thermally-conductive via through the insulating layer to the thermally-conductive frame to form the thermal conduction path.

16. The method of claim 12, further including:
forming a plurality of bumps over the thermally-conductive frame;
depositing an encapsulant over the first semiconductor die and bumps; and
removing a portion of the encapsulant to expose the bumps.

17. The method of claim 12, further including forming a shielding layer over the first semiconductor die.

18. The method of claim 12, further including depositing an underfill material between the first semiconductor die and the interconnect structure.

19. The method of claim 12, further including forming a bump over the first semiconductor die and electrically connected to the interconnect structure.

20. A semiconductor device, comprising:
a thermally-conductive frame;
an interconnect structure formed over the thermally-conductive frame, the interconnect structure including an electrical interconnect path and thermal conduction path;
a first semiconductor die mounted to the electrical interconnect path and thermal conduction path of the interconnect structure;
an opening formed in the thermally-conductive frame; and
a second semiconductor die mounted over a surface of the thermally-conductive frame opposite the first semiconductor die and electrically connected to the electrical interconnect path of the interconnect structure using a first bump disposed in the opening of the thermally-conductive frame.

21. The semiconductor device of claim 20, wherein the interconnect structure includes:
an insulating layer formed over the thermally-conductive frame;
a conductive layer formed over and extending through the insulating layer to form the electrical interconnect path; and
a thermally-conductive via formed through the insulating layer to the thermally-conductive frame to form the thermal conduction path.

22. The semiconductor device of claim 20, wherein a portion of a back surface of the first semiconductor die is removed.

23. The semiconductor device of claim 20, further including forming a shielding layer over the first semiconductor die.

24. The semiconductor device of claim 20, further including:
a plurality of second bumps formed over the thermally-conductive frame; and
an encapsulant deposited over the first semiconductor die and second bumps, wherein a portion of the encapsulant is removed to expose the second bumps.

25. The semiconductor device of claim 20, further including an underfill material deposited between the first semiconductor die and the interconnect structure.

26. The semiconductor device of claim 20, further including forming a second bump over the first semiconductor die and electrically connected to the interconnect structure.

* * * * *